(12) United States Patent
Kaushik et al.

(10) Patent No.: US 6,856,179 B2
(45) Date of Patent: Feb. 15, 2005

(54) CMOS BUFFER WITH REDUCED GROUND BOUNCE

(75) Inventors: Rajesh Kaushik, Haryana (IN); Rajesh Narwal, Karnal Haryana (IN)

(73) Assignee: STMicroelectronics Pvt. Ltd., Uttar Pradesh (IN)

( * ) Notice: Subject to any disclaimer, the term of this patent is extended or adjusted under 35 U.S.C. 154(b) by 0 days.

(21) Appl. No.: 10/662,952

(22) Filed: Sep. 12, 2003

(65) Prior Publication Data
US 2004/0108875 A1 Jun. 10, 2004

Related U.S. Application Data

(63) Continuation-in-part of application No. 10/206,135, filed on Jul. 26, 2002, now abandoned.

(30) Foreign Application Priority Data

Jul. 27, 2001 (IN) .................................... 804/DEL/2001

(51) Int. Cl.[7] ............................................... H03K 3/00
(52) U.S. Cl. ........................... 327/112; 326/26; 326/27
(58) Field of Search ................................ 327/108, 110, 327/112, 379, 382; 326/26, 27, 82, 83, 86, 87

(56) References Cited

U.S. PATENT DOCUMENTS

| | | | | |
|---|---|---|---|---|
| 4,777,389 A | * | 10/1988 | Wu et al. | 326/28 |
| 4,782,252 A | | 11/1988 | Levy et al. | 327/388 |
| 4,862,018 A | | 8/1989 | Taylor et al. | 326/27 |
| 5,124,579 A | | 6/1992 | Naghshineh | 307/443 |
| 5,148,056 A | | 9/1992 | Glass et al. | 307/443 |
| 5,153,457 A | | 10/1992 | Martin et al. | 326/84 |
| 5,168,176 A | * | 12/1992 | Wanlass | 326/87 |
| 5,315,187 A | | 5/1994 | Cheng | 327/384 |
| 5,438,278 A | | 8/1995 | Wong et al. | 326/27 |
| 5,473,263 A | | 12/1995 | Mahmood | 326/27 |
| 5,604,453 A | | 2/1997 | Pedersen | 327/112 |
| 6,366,114 B1 | * | 4/2002 | Liu et al. | 326/27 |
| 6,566,904 B2 | * | 5/2003 | van Bavel et al. | 326/30 |

* cited by examiner

Primary Examiner—Tuan T. Lam
(74) Attorney, Agent, or Firm—Lisa K. Jorgenson; Allen, Dyer, Doppelt, Milbrath & Gilchrist, P.A.

(57) ABSTRACT

A CMOS output buffer uses feedback from a ground node to reduce ground bounce by utilizing a tolerable ground bounce limit, making it less sensitive to operating conditions and processing parameters. An input to the NMOS device of the output buffer is provided by the output of a control element which receives a first input from a pre-driver and a second input (i.e., the feedback) from the ground node.

17 Claims, 7 Drawing Sheets

CMOS BUFFER WITH REDUCED GROUND BOUNCE

RELATED APPLICATION

The present application is a continuation-in-part of U.S. patent application Ser. No. 10/206,135 filed Jul. 26, 2002, now abandoned, the entire disclosure of which is incorporated herein by reference.

FIELD OF THE INVENTION

The present invention relates to the field of integrated circuits, and, more particularly, to a CMOS buffer.

BACKGROUND OF THE INVENTION

In integrated circuits, output buffers are used for interfacing core logic with external devices. One prominent problem in output buffers is "ground bounce." More particularly, one basic property of an inductor is that the change of current therethrough produces a voltage across the inductor, which is directly proportional to the rate of change of current through the inductor. This may be represented as:

$$dV = L\, dI/dT,$$

where dV is the voltage generated, L is the inductance, and dI/dT is the rate of change of the current.

Thus, it may be said that the voltage across the inductor bounces. When considered at the ground pin, this is referred to as ground bounce. Ground bounce occurs as a result of parasitic inductance of the integrated circuit and packaging interconnections. Ground bounce occurs when the pull down transistor switches from an off to an on state.

Referring to FIG. 1, when the pull down transistor N116 is turned ON, the potential developed across the capacitor C122 is coupled by the transistor N116 to the inductor L120. As a result, a transient is generated across inductor L120. A sudden increase of current flows from the output terminal O112 through the pull-down transistor N116 and through the parasitic inductance L120 to ground.

Due to the above noted properties of an inductor, the voltage at the source of the pull down transistor rises. This decreases the gate-source voltage of the pull down transistor. In the case where this rise in source voltage is very large, it can cause ringing, which is reflected in the output of other buffers which are connected to the same ground pin and whose outputs are stable at a low level. The worst case is when all of the buffers, except one whose output is stable at a low level, are connected between the same supply pins and switch from high to low, which may lead to false triggering if the ground bounce is not kept within certain limits. This, in turn, imposes a limit on the number of output buffers that can be connected to a single ground pin, thus increasing the number of ground pins on a chip.

Various techniques have been used to reduce ground bounce. For example, U.S. Pat. No. 5,124,579 discloses the use of a resistive device for delaying the turn-on time of the output transistors to limit the rate of increase of ground current. Yet, this method is limited in its ability to dynamically adjust to changing output conditions. Furthermore, the delays produced are manufacturing process dependent.

Another approach is disclosed in U.S. Pat. No. 5,148,056, in which feedback is taken from the output terminal of the buffer. However, this technique has poor sensitivity to the actual ground bounce, especially when it is produced by the switching of other buffers. Further, U.S. Pat. No. 5,604,453 teaches an approach which relies on the matching of the geometries of various individual devices rather than feedback. As a result, this approach is incapable of dynamically adjusting to changing output conditions. Mismatches arising out of process variations would also influence the effectiveness of this approach.

SUMMARY OF THE INVENTION

An object of the present invention is to overcome the above drawbacks and to provide a CMOS buffer with reduced ground bounce.

These and other objects, features, and advantages in accordance with the invention are provided by a CMOS buffer with reduced ground bounce which may include feedback means or a circuit for sensing the ground bounce voltage at a ground terminal. The feedback circuit may be connected to the input of a controlling means or control circuit for dynamically adjusting the rate of increase of the ground current in a manner that reduces the sensed ground bounce voltage to a level below a threshold while maintaining a desired speed of operation.

The feedback circuit may include an amplifier that amplifies the difference between the sensed output ground voltage and an internal reference ground voltage. The controlling circuit may include a slew-rate controlling circuit, for example. In particular, the slew-rate controlling circuit may dynamically adjust the gate voltage of the output NMOS transistor to limit the rate of increase of the current through the ground terminal.

BRIEF DESCRIPTION OF THE DRAWINGS

The invention will now be described with reference to the accompanying drawings, in which.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout, and prime notation is used to indicate similar elements in alternative embodiments.

Figure 1:
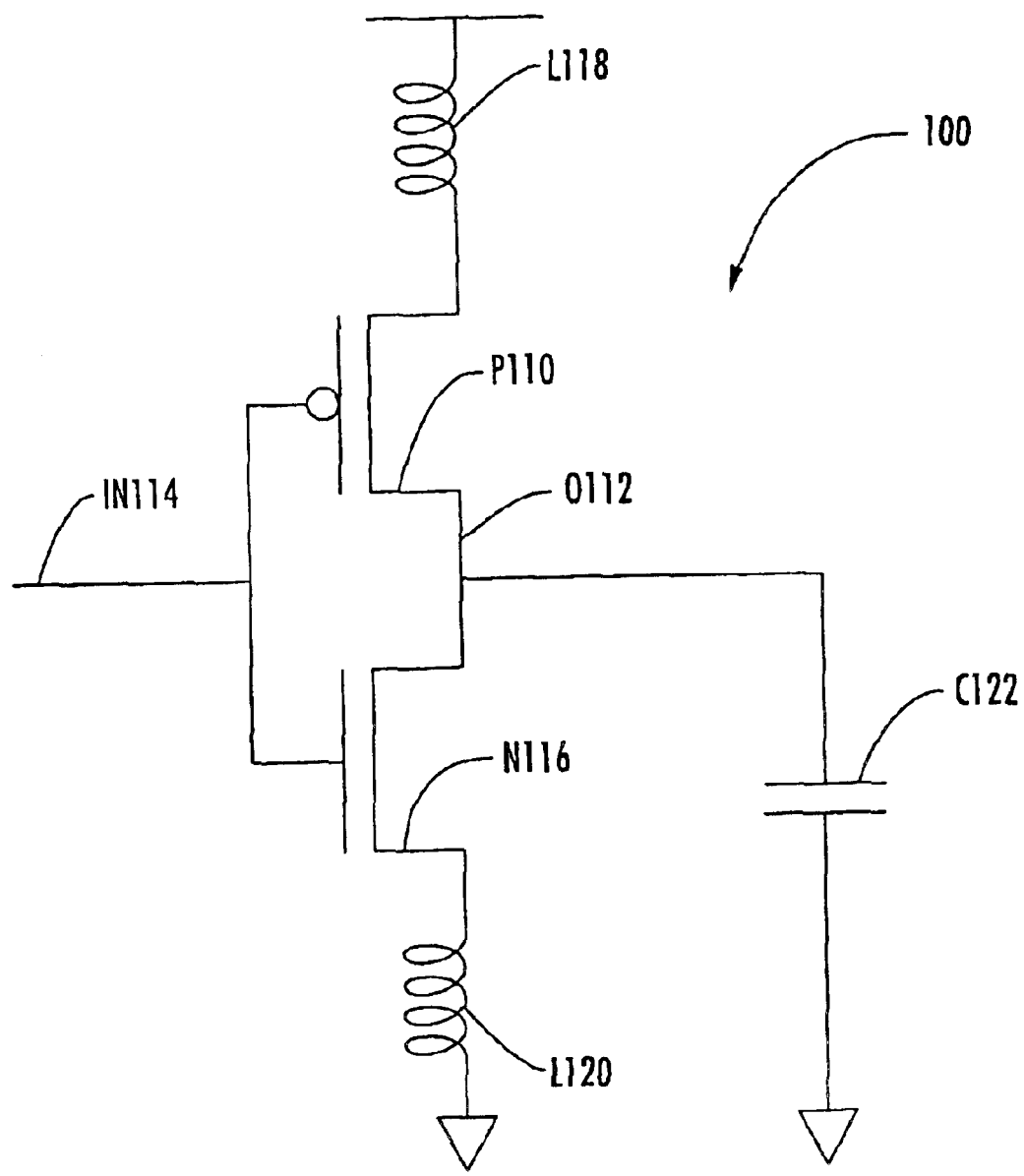
FIG. 1 is a schematic diagram of a basic inverter with parasitic package inductances in accordance with the prior art.
Figure 2:
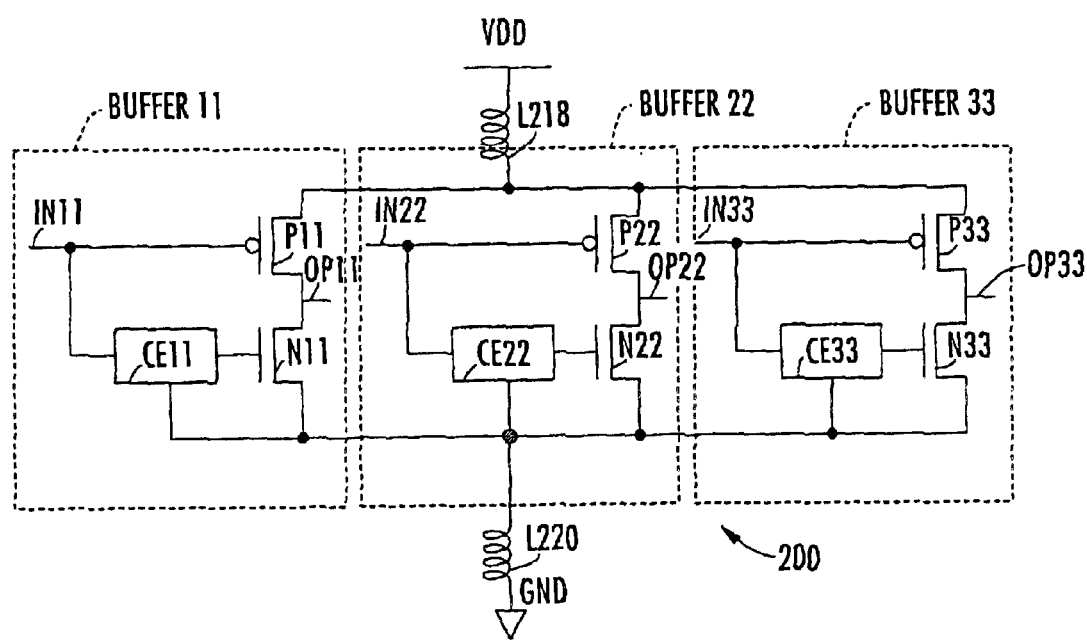
FIG. 2 is a schematic diagram of CMOS output buffers in accordance with the present invention.

Referring to FIG. 2, three output buffers BUFFER11, BUFFER22, and BUFFER33 in accordance with the invention are connected between common supplies VDD and GND through package inductances on the VDD and GND pins illustratively represented as inductors L218 and L220, respectively. The inputs to the buffers are IN11, IN22, and IN33, respectively, and the outputs are OP11, OP22, and OP33, respectively. Each buffer BUFFER11, BUFFER22, and BUFFER33 has its input connected to its pull-down transistor through a respective control element CE11, CE22, and CE33.

Figure 3:
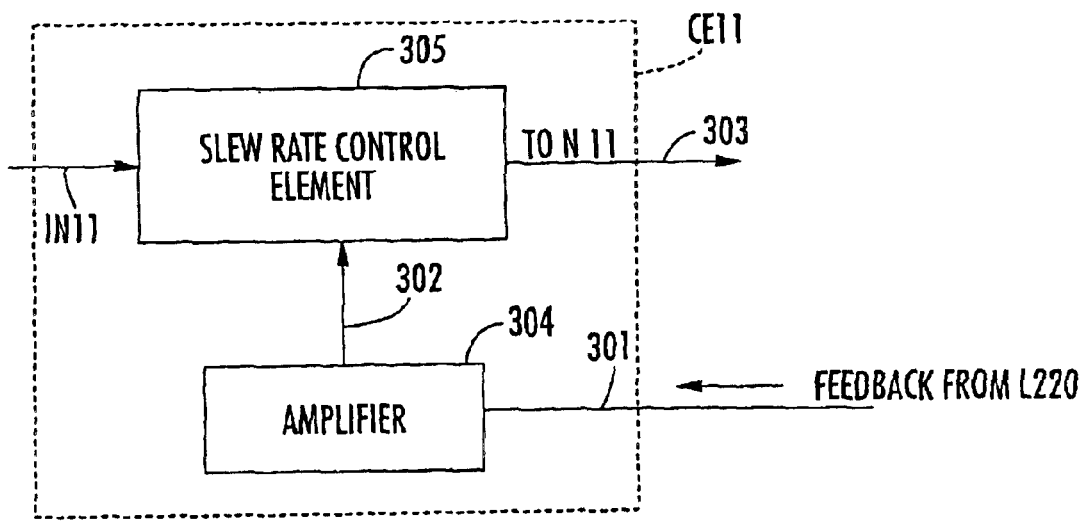
FIG. 3 is a schematic block diagram of a control element configuration for use with the CMOS output buffers of FIG. 2.

One configuration of a control element is illustrated in FIG. 3. Here, only BUFFER11 is considered for clarity of illustration. Input IN11 is connected to one end of the slew rate control element 305, while it receives its other input 302 from an amplifier 304. The amplifier 304 receives as its input 301 feedback from the inductor L220. The voltage at the input 301 varies dynamically according to ground bounce. This voltage is used to keep the bounce under control and at a selected level.

When the ground bounce at input 301 increases to a specific level, it increases the slew of the output signal on output 303 provided to the pull-down transistor N11. Further, when the ground bounce is not present, the input signal IN11 passes through the control element CE11 without any changes and reaches the gate of pull-down transistor N11.

Figure 4:
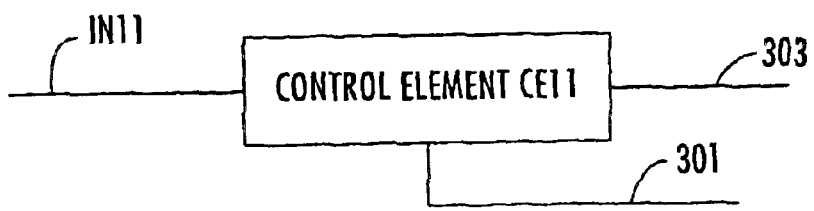
FIG. 4 is a schematic block diagram of an alternate control element configuration for use with the CMOS output buffers of FIG. 2.

An alternate control element configuration is illustrated in FIG. 4. The output 303 of control element CE11 is processed according to a given formula which depends upon the type of package and technology used.

A steady state condition will now be considered with reference to FIG. 2 where the input signal IN11 of the BUFFER11 is low, the input signal IN22 of the BUFFER22 is high, and the input signal IN33 of the BUFFER33 is also high. The pull-up transistor P11 is ON, P22 is OFF, and P33 is OFF. The pull-down transistor N11 is OFF, N22 is ON, and N33 is ON. The output of control element CE11 is low, as at this moment there is no bounce at the inductor L220. This pulls up the node OP11 high and also charges the load connected thereto. As the pull-down transistors N22 and N33 are ON, OP22 and OP33 are pulled down and stable at a low level.

Now we will consider the case when the input IN11 is switching from a low to high state. During this switching, as the bounce is produced in the inductor L220 it is fed back to the control element CE11. After the feedback has reached a particular selected level, the control element CE11 circuitry controls the output provided to the pull-down transistor N11 by increasing the slew of the signal on the output 303, thus regulating the current therethrough which decreases the ground bounce at L220. Due to this decrease in ground bounce, feedback magnitude also decreases and the input to the gate of the transistor N11 rises faster (i.e., with decreased slew), which again increases ground bounce. This cycle is repeated until the voltage at IN11 reaches its high state.

Figure 5:
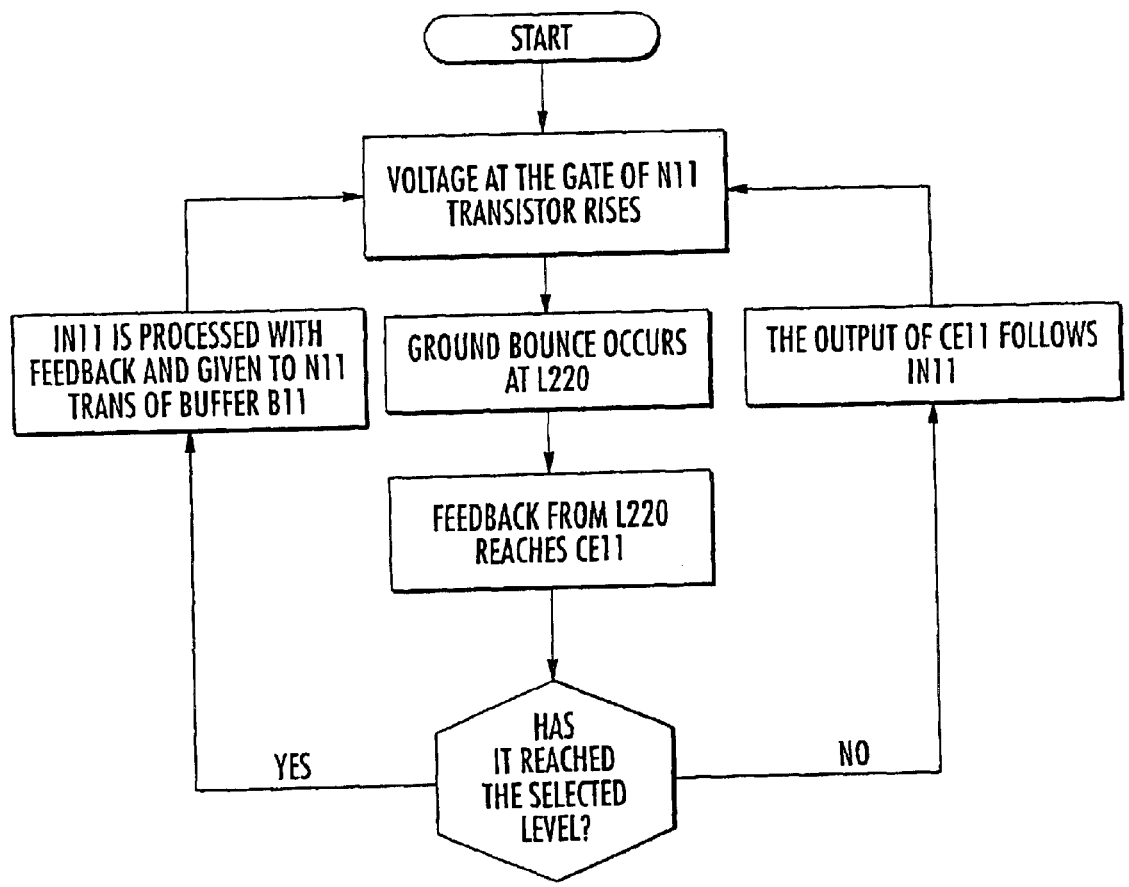
FIG. 5 is a flowchart illustrating operation of a CMOS output buffer in accordance with the present invention.

The above will be further understood with reference to the flow diagram of FIG. 5. The selected level of feedback (which is low as compared to the maximum tolerable ground bounce) at which the control element circuitry becomes active is determined based upon the delay of the control element circuitry. This configuration decreases the sensitivity of the circuitry to process parameters, as well as different voltages and temperatures, because it mainly depends on the feedback from the package inductance. If process models are slow, the bounce at the inductor L220 will be low and the circuit will be faster. Yet, if the process models are fast, the bounce at the inductor L220 will be greater, and the circuit will be slower, thus trying to neutralize the effect of process conditions on propagation delays.

It will be appreciated by those skilled in the art that the circuitry explained above is for reducing ground bounce. It will also be appreciated that similar circuitry may be used for controlling VDDBUMP, bounce at the VDD pin, and the inductance L218 in accordance with the present invention. "

Figure 6:
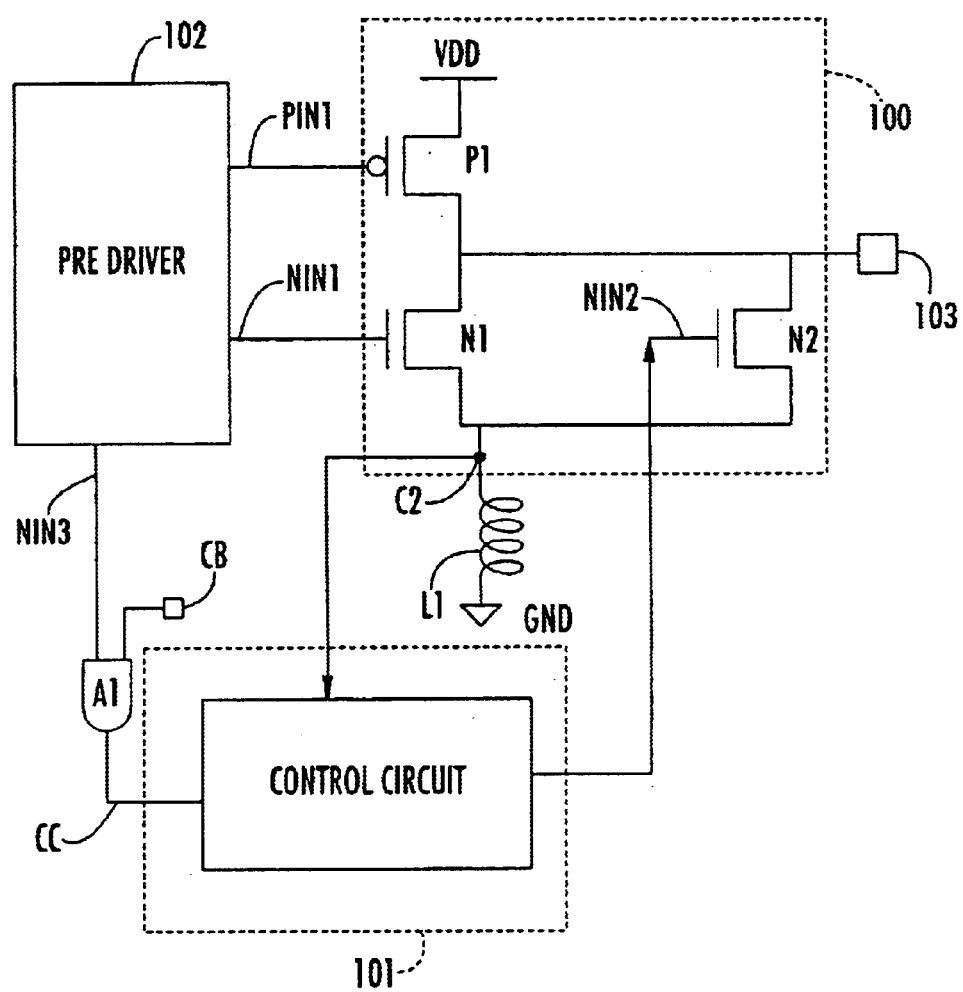
FIG. 6 is a simplified diagram of the output buffer showing control circuit as block 101 according to the present invention.

A more detailed embodiment of an output buffer and control circuit according to the present invention will now be described with reference to FIGS. 6–8. FIG. 6 illustrates a CMOS output buffer, including a pre-driver 102, a pad driver circuit 100, a control circuit 101 for controlling ground bounce and an AND gate A1. The output buffer also includes IO PAD 103. One input of A1 is connected to configuration bit CB while other input is connected to NIN3 which is coming from pre driver 102. Output driver 100 includes PMOS P1 with it's drain connected to the output pad 103 and source connected to power supply VDD. Output driver 100 also includes NMOSs N1 and N2 with their drains connected to output pad 103 and their sources connected to C2. The NMOS transistors are sized in a binary-weighted sequence. C2 is connected to ground GND via parasitic inductor L1. PIN1 and NIN1 are coming from predriver 102 and connected to the gates of transistor P1 and N1 respectively. NIN3 is coming from predriver 102 which is connected to one of the inputs of AND gate A1. NIN2 is gate voltage for N2 coming from control circuit 101."

Figure 7:
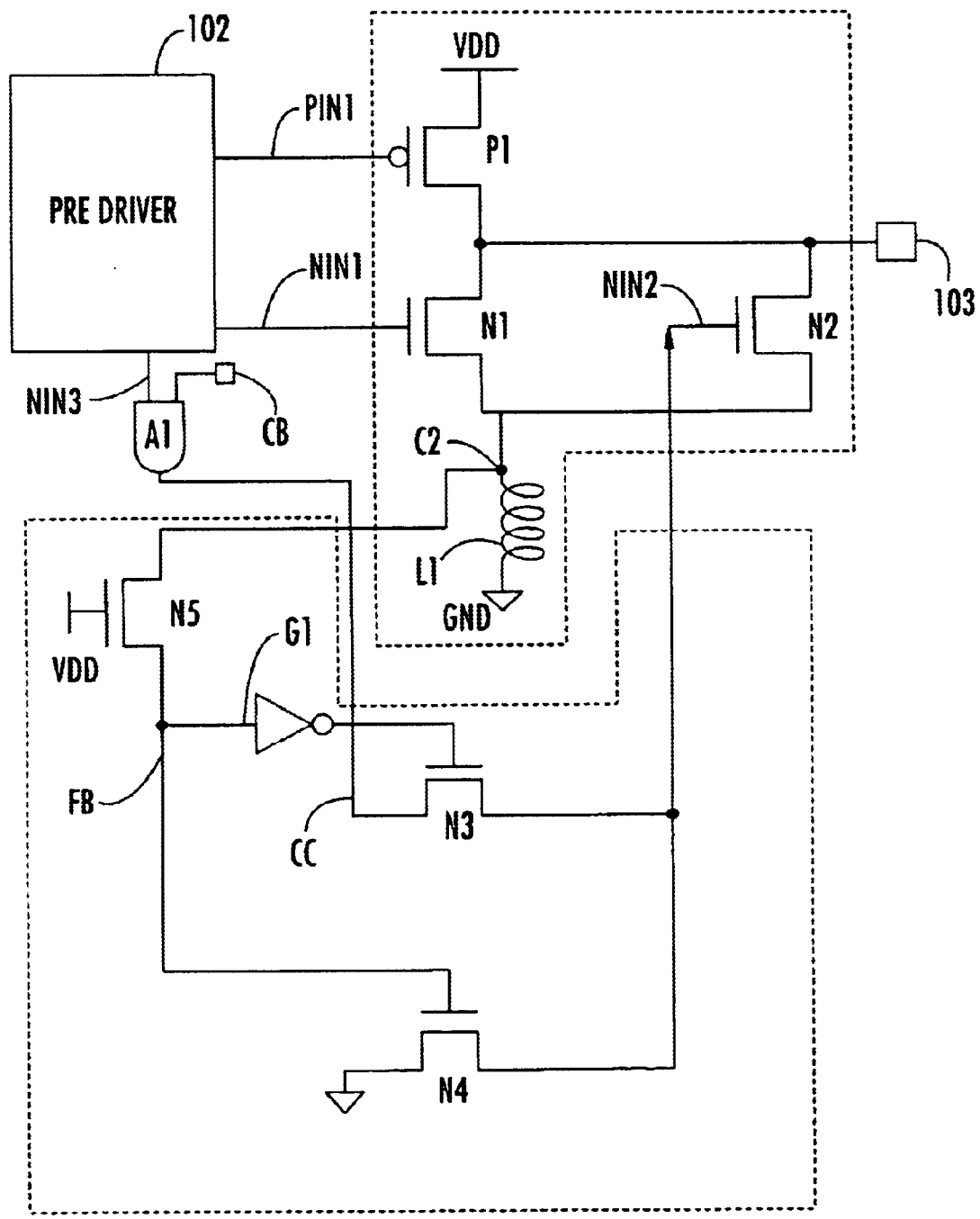
FIG. 7 is a simplified diagram of output buffer along with control circuit shown in detail.

More specifically, the output buffer as shown in FIG. 7 includes pad driver 100, Pre-driver 102, control circuit 101, AND gate A1 and pad 103. Control circuit 101 includes NMOSs N3, N4, N5 and inverter G1. The source of N4 is connected to ground while it's drain is connected to NIN2. The gate of N4 is connected to line FB. The output of inverter G1 is connected to the gate of N3. The source of N3 is connected to NIN2 while it's drain is connected to line CC. Drain of N5 is connected to node C2. Gate of N5 is connected to VDD and its source is connected to line FB. The input of inverter G1 is connected to line FB while it's output is connected to the gate of N3. Feedback is taken from node C2 which is connected to line FB via N5. N5 is used to protect the gates of G1 and N4 from any occasional high voltage noise at C2. N5 will never allow a voltage greater than VDD–Vt(N5) to pass through it.

Vmtp is maximum tolerable peak voltage. This is the maximum amplitude of ground bounce pulse that can be tolerated for a particular pulse width. Vtrip(G1) is the trip point voltage of inverter G1. Depending on the current sinking capability required either N1 is conducting or both N1 and N2 are conducting. This is decided by configuration bit CB. It is presumed that for lower sinking capability (CB=0) i.e when only N1 is conducting, ground bounce remains in acceptable limits. With CB=0 line CC remains at 0V.

With only N1 ON, voltage at node C2 is low enough (lower than Vtrip(G1)) to keep the gate of N3 at logic 1. This keeps NIN2 at 0V and hence N2 OFF. For higher sinking capability CB=1 Where both N1 and N2 are ON. In this case the current flowing through inductor L1 is high which raises the voltage at C2 above tolerable limit. The control circuit 101 controls the voltage at C2 so that it always remains within tolerable limits. Considering a stable condition when output from pre driver 102 i.e NIN1, PIN1 and NIN3 are all 0V. With CB=1 and NIN3=0V line CC remains at 0V. NIN1 is 0V which makes N1 OFF. Node C2 and line FB remains at 0V. The input to G1 is 0V while its output which is connected to the gate of N3 is at VDD. This makes N3 ON and hence makes NIN2 0V. The gate of N4 is connected to 0V which makes N4 OFF. With PIN1=0V P1 is ON, keeping PAD 103 at VDD. Now considering NIN1, PIN1 and NIN3 all makes a transition from logic low to high. This makes P1 OFF. Sizing of Predriver is such that slew rate of voltage (dV/dt) at NIN3 is much faster than NIN1. Sinking is faster as the control circuitry never allows ground bounce to exceed Vmtp. Also sinking capability of N1 is such that if only N1 is ON ground bounce never exceeds beyond maximum tolerable value Vmtp.

Now voltage at NIN3 and NIN1 starts increasing. Increase in voltage at NIN1 turns ON N1. At the same time the voltage at NIN3 also starts increasing and increases at a rate faster than NIN1. This makes line CC to go at logic 1. With N3 ON the voltage at line CC is transmitted to NIN2. This makes N2 ON. Now N1 and N2 both are ON to pull down PAD 103. This increases the current flowing through L1. Because of this voltage at C2 starts increasing the current flowing through inductor L1 is not constant therefore the voltage at point C2 is given by V(C2)=L1[di(t)/dt] i(t) is the current flowing through L1.

Depending on the maximum tolerable peak voltage (Vmtp) at C2 the trip point of G1 is adjusted. The threshold voltage of N4 is less as compare to the trip point of G1. As mentioned earlier Vmtp will be defined for a particular noise pulse width. The size of N4 is small in comparison to that of N3. As the voltage at C2 approaches threshold voltage of N4, it starts conducting. N4 tries to slow down the increase in voltage at NIN2. Now depending on the operating conditions and the type of models used two things can happen.

Firstly, under best operating conditions when both N1 and N2 starts conducting, the voltage at C2 starts increasing. The trip point of G1 is higher than that of threshold voltage of N4. Increase in the voltage at C2 first of all turns N4 ON. Now both N4 and N3 are ON. But the size of N4 is much smaller than that of N3. Conducting N4 slightly reduces the voltage slew rate (dv/dt) at NIN2. But still the slew rate is enough high and the voltage at C2 is still increasing. As the voltage at C2 reaches the trip point of G1, the output of G1 becomes zero which makes N3 OFF. With N3 OFF and N4 ON the magnitude of voltage at NIN2 starts decreasing. This will reduce the conductivity of N2 and hence the voltage at C2 also starts decreasing. Reduction in voltage at C2 again trips G1 which again turns ON N3 and voltage at NIN2 starts increasing. This will again increase current through inductor L1. If the voltage at C2 again exceeds the trip point of G1, the above explained process is repeated again. "

Figure 8:
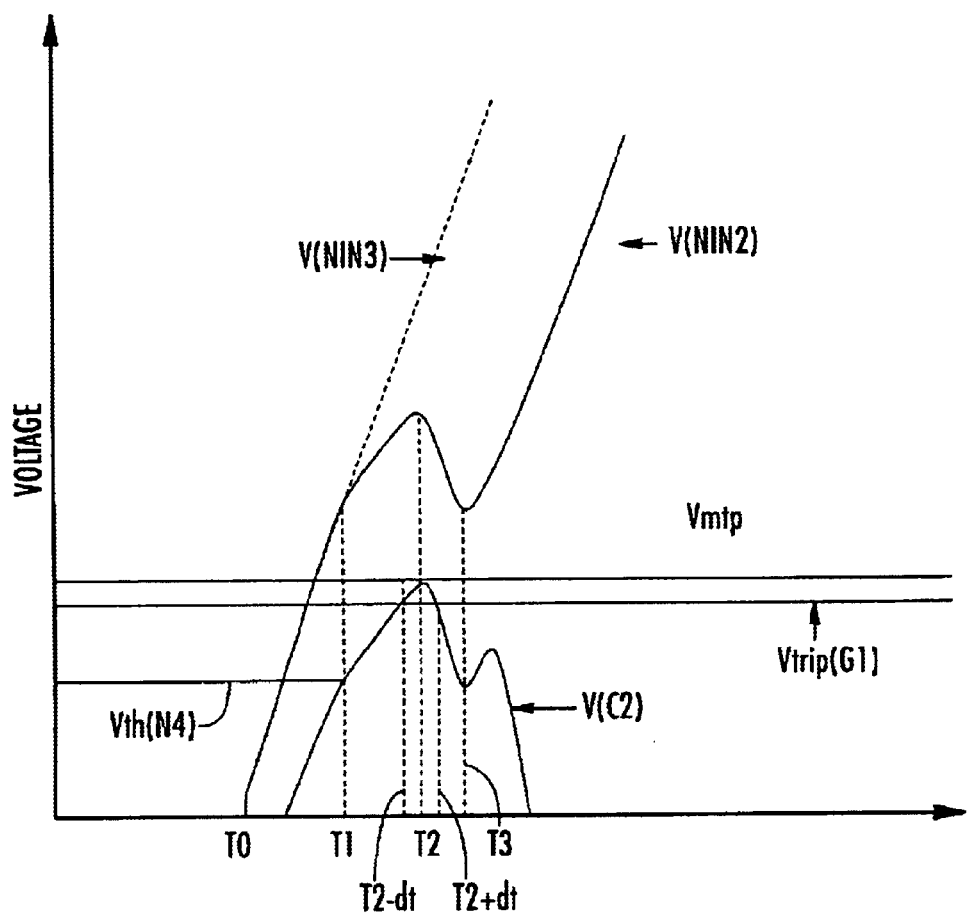
FIG. 8 is a voltage waveforms diagram showing the operation of circuit.

FIG. 8 shows the voltage waveforms at different nodes. NIN2 starts increasing from 0V at time T0. As N2 becomes ON ground bounce starts increasing. At time T1 V(C2) crosses the threshold level of N4. This will reduce the slew rate of NIN2. Reduction in the slew rate of NIN2 can be seen from time T1 to T2. Even with the reduction in slew rate ground bounce (V(C2)) still increasing. At time (T2–dt) G1 trips and makes N3 OFF. At time T2 voltage at line NIN2 starts falling because of N4. This reduces the current flowing through L1 because of which voltage at node C2 starts decreasing. At time (T2+dt) G1 again trips making N3 ON. NIN2 doesn't start increasing instantaneously as N3 has some delay and also N4 is still conducting to stop NIN2 from increasing. At T3 NIN2 starts increasing which again results in increase in the ground bounce. But this time the magnitude of voltage at V(C2) remains well below Vtrip (G1). The control circuit is working on feedback principle so it never allows ground bounce to cross Vmtp, Secondly, under worst operating conditions magnitude of voltage at C2 is less than Vtrip(G1). The output of G1 always remains VDD and hence N3 always remains ON. During slow operating conditions its N4 which slightly reduces the slew rate at NIN2. The above explained circuitry not only controls the ground bounce but it also tries to equalize delays under different operating conditions. Under fast operating conditions as the bounce approaches Vmtp, N3 becomes OFF which controls the bounce from further increase. With N3 OFF and N4 ON, the voltage at NIN2 actually starts falling as shown in FIG. 8. This reduces the current flowing through L1 because of which voltage at node C2 starts decreasing. This makes N4 less conducting. After a time 2dt N3 again turns ON but voltage at NIN2 starts increasing only after a delay of T3–(T2+dt) as shown in FIG. 8 whereas under slow operating conditions N3 is always ON and a slight reduction in the slew rate by N4 is sufficient to control the bounce. Thus in best operating conditions the bounce is controlled by actually decreasing the voltage at NIN2 whereas in worst operating conditions the bounce is controlled by slightly reducing the slew rate of voltage at NIN2."

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. An output buffer comprising:
   voltage terminals;
   an output stage including multiple, independently controllable output switches;
   an output driver stage providing a control signal for the output stage; and
   a correcting stage monitoring a voltage of at least one of the voltage terminals in view of the control signal, and dynamically controlling at least one of the controllable output switches so as to provide rapid response while limiting a voltage bounce at the voltage terminals within a predefined limit, the correcting stage including
      a first feedback switch connected between the output driver stage and the at least one controllable output switch,
      an inverter connected between the at least one voltage terminal and a control terminal of the first feedback switch, the inverter having a trip point controlled by the voltage on the at least one voltage terminal, and
      a second feedback switch connected between the at least one voltage terminal and the at least one controllable output switch.

2. An output buffer according to claim 1 wherein the correcting stage disables the at least one controllable output switch via the inverter whenever a sensed voltage bounce increases beyond the trip point and enables the at least one controllable output switch whenever the sensed voltage bounce falls below the trip point.

3. An output buffer according to claim 1 wherein the independently controllable output switches comprise switching transistors having output terminals connected together, and at least one of the switching transistors has a control terminal operated by the correcting stage.

4. An output buffer according to claim 3 wherein the switching transistors comprise MOS transistors.

5. An output buffer according to claim 4 wherein the MOS transistors are sized in a binary-weighted sequence.

6. An output buffer comprising:

voltage terminals;

an output stage including a plurality of independently controllable switching transistors having output terminals connected together;

an output driver stage providing a control signal for the output stage; and a correcting stage monitoring a voltage of at least one of the voltage terminals, and controlling at least one of the controllable switching transistors to limit a voltage bounce at the voltage terminals within a predefined limit, the correcting stage including a first feedback switch connected between the output driver stage and the at least one controllable switching transistor, an inverter connected between the at least one voltage terminal and a control terminal of the first feedback switch, the inverter having a trip point controlled by the voltage on the at least one voltage terminal, and a second feedback switch connected between the at least one voltage terminal and the at least one controllable switching transistor.

7. An output buffer according to claim 6 wherein the correcting stage disables the at least one controllable switching transistor whenever a sensed voltage bounce increases beyond the trip point and enables the at least one controllable switching transistor whenever the sensed voltage bounce falls below the trip point.

8. An output buffer according to claim 6 wherein at least one of the switching transistors has a control terminal operated by the correcting stage.

9. An output buffer according to claim 8 wherein the switching transistors comprise MOS transistors, 10. An output buffer according to claim 9 wherein the MOS transistors are sized in a binary-weighted sequence.

11. A method for reducing voltage bounce while maintaining speed of operation of an output buffer comprising:

providing multiple, independently controllable output switches in an output stage of the output buffer;

providing a control signal to the output stage from an output driver stage; and monitoring a voltage of at least one terminal, with a correcting stage, whenever the control signal changes state and dynamically controlling at least one of the controllable output switches so as to provide rapid response while limiting a voltage bounce at the at least one terminal within a predefined limit, the correcting stage including a first feedback switch connected between the output driver stage and the at least one controllable output switch, an inverter connected between the at least one voltage terminal and a control terminal of the first feedback switch, the inverter having a trip point controlled by the voltage on the at least one voltage terminal, and a second feedback switch connected between the at least one voltage terminal and the at least one controllable output switch.

12. A method according to claim 11 wherein the correcting stage disables the at least one controllable output switch whenever a sensed voltage bounce increases beyond the trip point and enables the at least one controllable output switch whenever the sensed voltage bounce falls below the trip point.

13. A method for reducing voltage bounce while maintaining speed of operation of an output buffer comprising:

providing a plurality of independently controllable switching transistors having output terminals connected together in an output stage of the output buffer;

providing a control signal for the output stage; and monitoring a voltage of at least one terminal, with a correcting stage, whenever the central signal changes state and dynamically controlling at least one of the controllable switching transistors to limit voltage bounce at the at least one terminal within a predefined limit, the correcting stage including a first feedback switch receiving the control signal and connected to the at least one controllable switching transistor, an inverter connected between the at least one voltage terminal and a control terminal of the first feedback switch, the inverter having a trip point controlled by the voltage on the at least one voltage terminal, and a second feedback switch connected between the at least one voltage terminal and the at least one controllable switching transistor.

14. A method according to claim 13 wherein the correcting stage disables the at least one controllable switching transistor whenever a sensed voltage bounce increases beyond the trip point and enables the at least one controllable switching transistor whenever the sensed voltage bounce falls below the trip point.

15. A method according to claim 14 wherein at least one of the switching transistors has a control terminal, operated by the correcting stage.

16. A method according to claim 14 wherein the switching transistors comprise MOS transistors.

17. A method according to claim 16 wherein the MOB transistors are sized in a binary-weighted sequence.

* * * * *

UNITED STATES PATENT AND TRADEMARK OFFICE
CERTIFICATE OF CORRECTION

PATENT NO. : 6,856,179 B2  
DATED : February 15, 2005  
INVENTOR(S) : Kaushik et al.

It is certified that error appears in the above-identified patent and that said Letters Patent is hereby corrected as shown below:

Column 4,  
Line 11, delete " ." " insert -- . --

Column 5,  
Line 52, delete " ." " insert -- . --

Column 6,  
Line 24, delete " ." " insert -- . --

Column 8,  
Line 24, delete "central" insert -- control --  
Line 50, delete "MOB" insert -- MOS --

Signed and Sealed this

Ninth Day of August, 2005

JON W. DUDAS  
*Director of the United States Patent and Trademark Office*